(12) United States Patent
Sim et al.

(10) Patent No.: US 6,424,578 B2
(45) Date of Patent: Jul. 23, 2002

(54) VOLTAGE DETECTING CIRCUIT FOR SEMICONDUCTOR MEMORY DEVICE

(75) Inventors: Jae-Yoon Sim; Jei-Hwan Yoo, both of Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/748,350

(22) Filed: Dec. 22, 2000

(30) Foreign Application Priority Data

May 30, 2000 (KR) ............................................. 00-29354

(51) Int. Cl.[7] ................................................. G11C 7/00
(52) U.S. Cl. ..................... 365/189.09; 365/226; 363/59; 363/60
(58) Field of Search ........................... 365/189.09, 226; 327/538, 540, 541; 363/59, 60

(56) References Cited

U.S. PATENT DOCUMENTS 5,768,115 A * 6/1998 Pascucci et al. .............. 363/59
5,808,953 A * 9/1998 Kim et al. .................. 365/226
6,041,012 A * 3/2000 Banba et al. ................ 365/226
6,104,659 A * 8/2000 Yagishita et al. ........... 365/226

* cited by examiner

Primary Examiner—Son Mai
(74) Attorney, Agent, or Firm—Marger Johnson & McCollom, P.C.

(57) ABSTRACT

A voltage detecting circuit includes a first voltage generator that provides a reference voltage, a second voltage generator that provides a comparison voltage in response to a boosted voltage, and a differential amplifier that provides an amplified difference signal to generate a voltage level detection signal in response to a voltage difference between the reference voltage and the comparison voltage. A bypass circuit is coupled to the amplified signal to detect a target VPP level suitable for a test mode by providing a current path in response to the comparison voltage when the comparison voltage reaches a predetermined level. The voltage detecting circuit thereby allows a precise and stable detecting operation to be performed regardless of the operation mode or process or temperature variations.

20 Claims, 4 Drawing Sheets

101,102
201,202

VOLTAGE DETECTING CIRCUIT FOR SEMICONDUCTOR MEMORY DEVICE

This application relies for priority upon Korean Patent Application No. 2000-29354, filed on May 30, 2000, the contents of which are herein incorporated by reference in their entirety.

FIELD OF THE INVENTION

The present invention relates to voltage detecting circuits for use in semiconductor memory devices, and more particularly, to a boosted voltage detecting circuit for detecting a stable boosted voltage level in semiconductor memory devices.

BACKGROUND OF THE INVENTION

High-capacity semiconductor memory devices, such as dynamic random access memories (DRAMs), utilize a low voltage power supply to decrease power consumption and increase reliability. In such devices, it is desirable to utilize a boosted voltage (VPP) to improve the transfer characteristics of certain circuits. For example, in order to ensure accurate and reliable operation of word line driver circuits, a boosted voltage VPP is used as the power supply voltage to drive word line voltages higher than the low voltage level of the low voltage power supply.

In a semiconductor memory device, a VPP generator is used to generate the boosted voltage VPP. The VPP generator includes a pumping circuit driven by an oscillator, and a VPP level detecting circuit that controls the operation of the oscillator. The VPP level detecting circuit detects the VPP level that is usually determined by the usage of the VPP voltage and compares it to a target VPP level. When the VPP level reaches the target level, the detecting circuit activates a detection signal that causes the oscillator to stop operating. This, in turn, causes the pumping circuit to stop pumping. While the pumping circuit is deactivated, as the VPP is used as a power source, the VPP voltage level drops. When the VPP voltage level drops below the target VPP level, the detecting circuit deactivates the detection signal, causing the pumping circuit to resume pumping.

When using a boosted voltage VPP, it is important to get an exact target level because an unnecessarily higher or lower VPP level than the target level may result in increased power consumption, increased stress to the device, and poor transistor performance. A precise and stable detecting circuit is therefore required.

A conventional VPP level detecting circuit of a semiconductor memory device is illustrated in FIG. 1. Referring to FIG. 1, the detecting circuit includes a voltage generator 10 for generating a comparison voltage, and a driving circuit 20 for detecting a target VPP level and for generating a voltage level detection signal (DET). The voltage generator 10 includes serially connected NMOS transistors 11, 12, and 13. One end of the voltage generator 10 is coupled to a power supply voltage (VDD), and an opposite end is coupled to a ground voltage (VSS). A gate of transistor 12 is connected to the power supply voltage VDD, and gates of transistors 11 and 13 are connected to the boosted voltage VPP. The driving circuit 20 includes three inverters 21, 22, and 23. An input of inverter 21 is connected to node A.

Assuming that the equivalent resistance values of the source drain path of transistors 11, 12, and 13, are R1, R2, and R3, respectively, then the voltage of node A can be expressed by the equation:

$$VA = VDD * \{(R2+R3)/(R1+R2+R3)\}.$$

As the boosted voltage VPP level increases, the resistance values of transistors 11 and 13 decrease because their gates are connected to the boosted voltage VPP. The resistance value of transistor 12, however, remains almost unchanged because its gate is connected to the power supply voltage VDD, which has a specific and fixed value. As the boosted voltage VPP level increases, therefore, the voltage level of node A also increases.

A logic threshold voltage of a P-type MOS (PMOS) or an N-type MOS (NMOS) inverter is determined by its width/length ratio. An inverter starts to change its output state around the logic threshold voltage. If the voltage level of node A is higher than the logic threshold voltage level of inverter 21, therefore, the voltage level detection signal DET, output from inverter 23, becomes low and a pumping operation is stopped by the voltage level detection signal DET. If the voltage level of node A is lower than the logic threshold voltage, however, the voltage level detection signal DET becomes high and the pumping operation resumes. To implement the target VPP level detection operation, the voltage level of node A at the target VPP level may be adjusted to around the logic threshold voltage of inverter 21 by controlling the sizes of transistors 11, 12, and 13, and the inverter 21.

Unfortunately, the conventional detecting circuit described above has a number of drawbacks. Among other things, this detecting circuit is sensitive to process and temperature variations. The voltage of node A at the target VPP level and the logic threshold voltage of the inverter 21, for instance, vary with process and temperature variations. It is also possible for process and temperature variations to cause these two voltages to shift in different directions from each other because the inverter 21 includes both PMOS and NMOS transistors, and the voltage generator 10 includes only NMOS transistors. Because of these problems, the target VPP level may not be able to be accurately detected.

Variation of the detected VPP level due to process and temperature variations is even more serious during the high voltage test mode (such as a burn-in test mode) in comparison to a normal operation mode (such as a normal read or write mode). Another problem during high voltage tests is that it is difficult to get a target VPP level suitable for a high voltage test mode since the resistance value of the voltage generator 10 is designed for the normal operation mode.

Finally, the voltage gain of node A responsive to the variation of the VPP level is so small (0.1–0.2) that variation of the logic threshold voltage due to process and temperature variations can critically vary the detected VPP level. In other words, the variation of node A voltage resulting from responding to the variation of VPP is relatively so small in comparison to the variation of logic threshold voltage of inverter 21 due to the process and temperature variations that a precise detection operation cannot be implemented using the prior art configuration.

SUMMARY OF THE INVENTION

It is therefore an object of the present invention to provide a voltage detecting circuit capable of reliably and precisely detecting a target voltage level.

It is another object of the invention to provide a voltage detecting circuit that is insensitive to process and temperature variations.

It is still another object of the invention to provide a voltage detecting circuit capable of detecting a target voltage level suitable for both a normal operation mode and a test mode.

It is still another object of the invention to provide a proper VPP level for tests in a wide VDD range.

In order to attain the foregoing objects and advantages, a voltage detecting circuit according to one embodiment of this invention includes a first voltage generator, a second voltage generator, and a differential amplifier. The first voltage generator is coupled to a first power supply voltage to provide a reference voltage. The second voltage generator is coupled to a second power supply voltage to provide a comparison voltage. The differential amplifier receives the reference voltage and the comparison voltage and amplifies a voltage difference between the reference voltage and the comparison voltage. A bypass circuit is coupled to an output of the differential amplifier to provide a current path to the amplified voltage in response to the comparison voltage. And a driving circuit receives the amplified voltage to generate a voltage level detection signal. The bypass circuit starts to provide a current path when the comparison voltage reaches a predetermined level.

According to another aspect of this invention, the first voltage generator can include a first resistor and a second resistor coupled together in series between the first power supply voltage and a ground voltage. The second voltage generator can include a third resistor and a fourth resistor coupled together in series between the second power supply voltage and the ground voltage. The bypass circuit can include a transistor and a diode coupled together in series between the output of the differential amplifier and the ground voltage. The transistors of the bypass circuit turn on to provide a current path in response to a comparison voltage when the comparison voltage reaches a predetermined level in the test mode.

Using a bypass circuit that provides a current path to an output of a differential amplifier in the test mode allows the voltage detection circuit of this invention to obtain a target VPP level that is suitable for both a normal operation mode and a test mode. A stable and precise detection operation—one that is unaffected by process and temperature variations—is made possible using the invention.

BRIEF DESCRIPTION OF THE DRAWINGS

Further objects and advantages of the invention will be become more readily apparent from the following detailed description of preferred embodiments, which follows with reference to the accompanying drawings, in which like numbers refer to like elements, wherein.

DESCRIPTION OF PREFERRED EMBODIMENTS

The present invention will now be more fully described with reference to preferred embodiments thereof. It should be noted, however, that the invention may be modified in form and detail and should therefore not be construed as being limited to the embodiments set forth herein. These embodiments are provided to inform the reader and more fully convey the subject matter of the invention to those skilled in the art, but are not to be construed as limiting the scope of the invention in any way.

Figure 1:
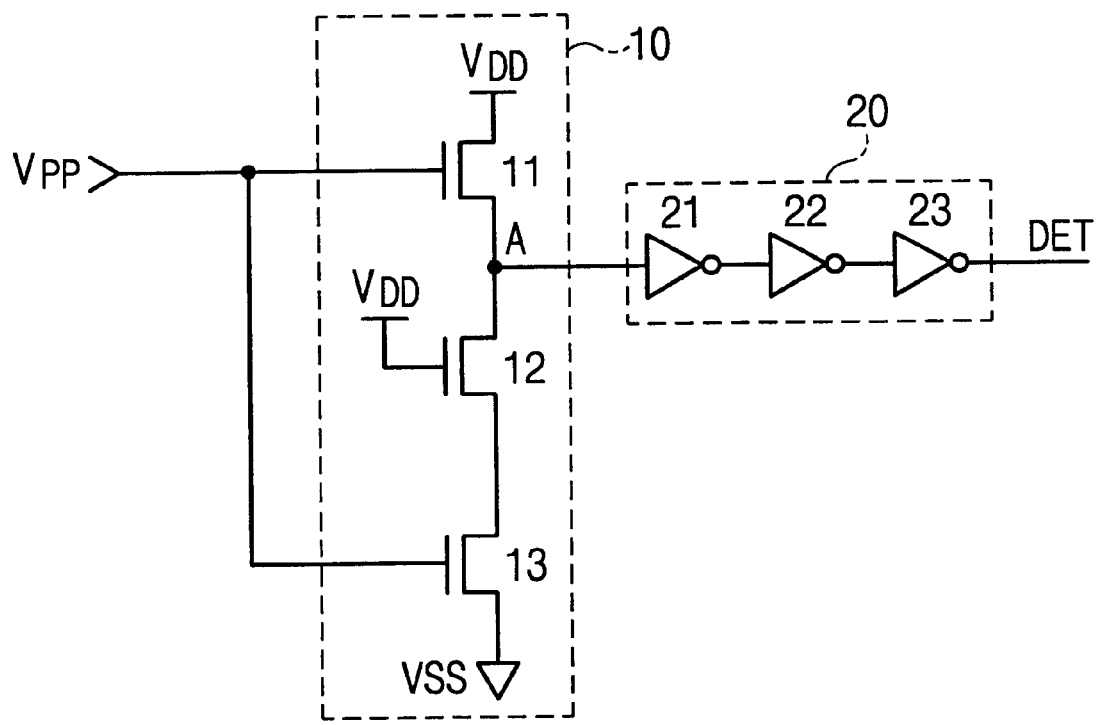
FIG. 1 is a schematic circuit diagram illustrating a conventional voltage detecting circuit according to the prior art.
Figure 2:
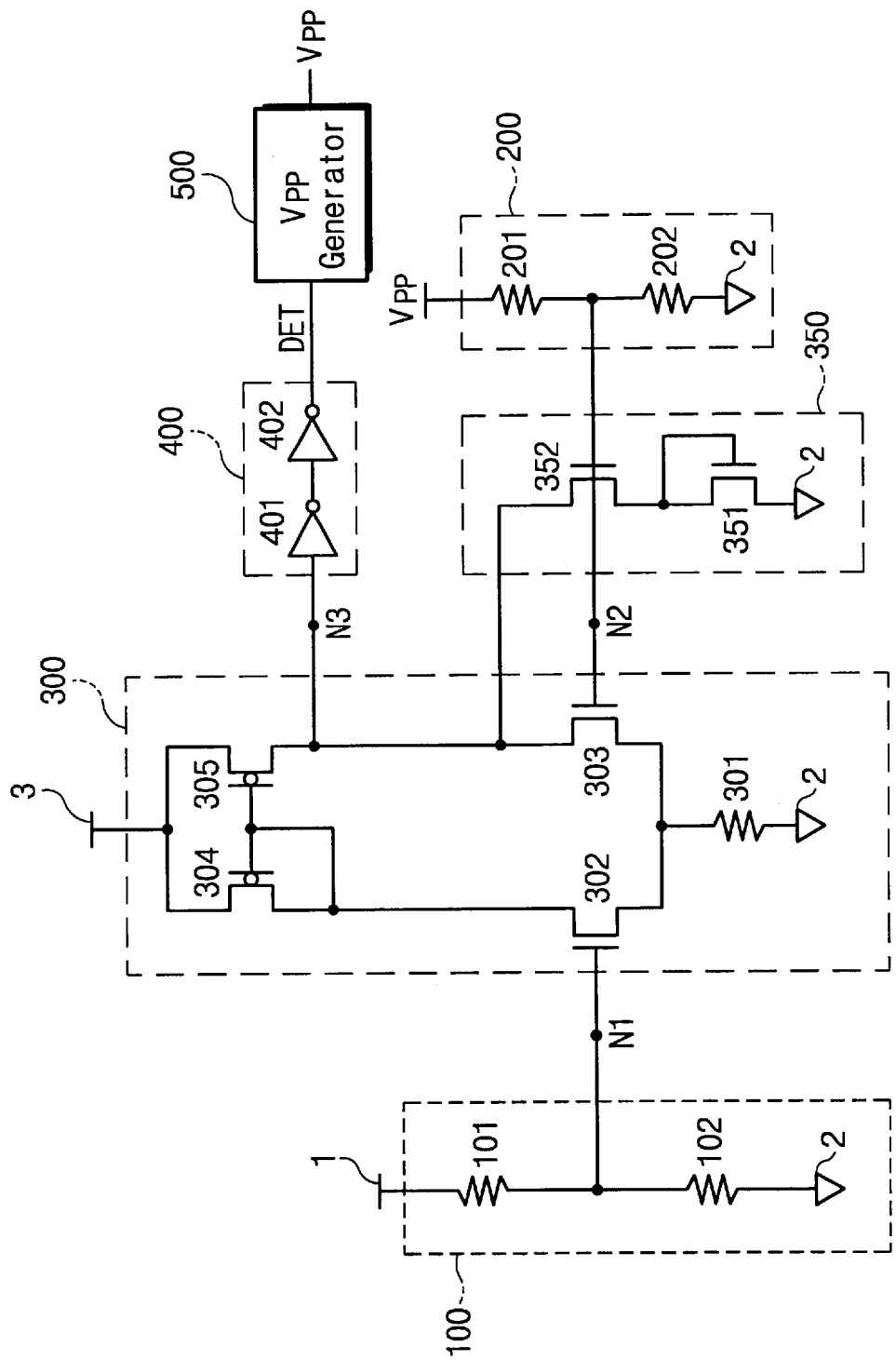
FIG. 2 is a schematic circuit diagram illustrating an embodiment of a voltage detecting circuit according to the present invention.

Referring to FIG. 2, the voltage detecting circuit according to a preferred embodiment includes a first voltage generator 100, a second voltage generator 200, a differential amplifier 300, and a bypass circuit 350. An output of the first voltage generator 100 is connected to an input N1 of the differential amplifier 300. An output of the second voltage generator 200 and an input of the bypass circuit 350 are each connected to another input N2 of the differential amplifier 300. An output of the bypass circuit 350 is connected to the output N3 of the differential amplifier 300. A driving circuit 400 is also coupled to the output N3 of the differential amplifier 300. And a VPP generator 500 is coupled to an output DET of the driving circuit 400.

The first voltage generator 100 has two resistors 101 and 102 coupled between a power supply voltage 1 and a ground voltage 2, and provides a reference voltage into a first input N1 of the differential amplifier 300 in response to the power supply voltage 1. Similarly, the second voltage generator 200 has two resistors 201 and 202 coupled between VPP and the ground voltage 2, and provides a comparison voltage responding to the VPP level variation into a second input N2 of the differential amplifier 300. The first and second voltage generators 100 and 200 act as voltage dividers to the power supply voltage 1 and the VPP respectively.

The differential amplifier 300 includes a resistor 301, two NMOS transistors 302 and 303, and two PMOS transistors 304 and 305. The differential amplifier 300 is coupled between a power supply voltage 3 and the ground voltage 2. The resistor 301 acts as a current source that may instead be implemented by using a MOS transistor.

The power supply voltage 3 can be either identical to or different from the power supply voltage 1, depending on noise considerations. In high density memory devices, it is generally desirable to use separate power supplies to reduce the influence of noise from the power supply voltage for external circuitry. The power supply voltage for a cell array that needs a stable power supply voltage, for example, can be separated from the power supply voltage for peripheral circuitry where more power supply voltage noises occur. A separate, stable power supply voltage is desirable because cell arrays are generally quite sensitive to noise from power supply voltages. In the preferred embodiment, the power supply voltage for the cell array can be coupled to the first voltage generator 100 to generate a more stable reference voltage. The power supply voltage for peripheral circuitry can be supplied to the remaining circuits of the present embodiment. Alternatively, however, if noise problems do not present serious concerns, the power supply voltage for the peripheral circuitry can be used for each of the circuits of the present invention.

The differential amplifier 300 compares the comparison voltage at one of its inputs N2 with the reference voltage at the other one of its inputs N1. The reference voltages at node N1 for each of the normal operation and test modes, and the comparison voltage at node N2 without the bypass circuit can be expressed by the following equations:

$$VN1normal=VDD(normal)*R(102)/\{R(101)+R(102)\}$$

$$VN1test=VDD(test)*R(102)/\{R(101)+R(102)\};$$

and $$VN2=VPP*R(202)/\{R(201)+R(202)\}.$$

The reference voltage does not change in a given operation mode since the power supply voltage is fixed according to the mode of operation (i.e., 3V for the normal operational mode, 6V for the test mode). Where the VDD value is fixed, it is apparent from the foregoing expressions that the reference voltage does not change in a given operation mode. The differential amplifier 300 generates an amplified signal at an output N3 corresponding to whether the comparison voltage is higher or lower than the reference voltage. If the comparison voltage is higher than the reference voltage, an amplified low level voltage is generated. If the comparison voltage is lower than the reference voltage, an amplified high level voltage is generated.

Usually, the variation in desired target VPP level between the normal and test modes is not directly proportional to the variation of VDD between these two modes. For example, when VDD doubles from 3V in the normal operation mode to 6V in the test mode, the desired target VPP level does not double. Instead, in this instance, although the target VPP level in the normal operation mode is about 4V, about 7V provides a suitable target VPP level for the test mode. Unfortunately, because of the linear characteristics of resistors, when resistor values of the voltage divider for generating the reference voltage are selected for the normal operation mode, the reference voltage level generated through those resistors due to the raised VDD of the test mode is relatively high in comparison to a desired reference voltage. The detected VPP level may therefore be relatively high in comparison to the desired target VPP level in the test mode. A single voltage divider for the reference voltage consequently cannot alone provide a reference voltage suitable for both operation modes.

Still referring to FIG. 2, the bypass circuit 350 includes a transistor 352 and a diode-connected transistor 351 coupled together in series between the output N3 of the differential amplifier 300 and the ground voltage 2. The two transistors 351 and 352 in this embodiment have the same threshold voltage (Vt) because they are the same type of NMOS transistor. A gate of the transistor 352 is coupled to one of the inputs N2 of the differential amplifier 300. The bypass circuit 350 of this embodiment functions to lower the detected VPP level in high VDD test mode. The bypass circuit 350 is able to provide a proper VPP level for the test mode over a wide range of VDD levels. The difference between the normal mode and test mode VDD values can therefore be used as another test VDD value. Specifically, when the voltage level of the node N2, responsive to VPP in the test mode, reaches twice the threshold voltage (Vt) of transistor 351, the two transistors 351 and 352 are turned on slightly and begin to provide a current path from the output N3 of the differential amplifier 300 to the ground voltage 2. As a result, the bypass circuit lowers the voltage level of the output N3 of the amplifier 300. A detection operation can thereby take place at a lower reference voltage level and the desired target VPP level suitable for the test mode can be obtained.

To prevent current from flowing through the bypass circuit 350 in the normal operation mode, the voltage level of node N2 at the target VPP level in the normal operation mode should be lower than twice the threshold voltage Vt of transistor 351. The values of resistors 201 and 202 should therefore be determined considering the voltage level of node N2 at the target VPP level in the normal operation mode.

The driving circuit 400 includes two inverters 401 and 402 connected together in series. The inverter 401 detects the amplified signal by comparing it with the logic threshold voltage of inverter 401. When the amplified low level voltage is generated at the output N3 of the differential amplifier 300, the inverter 401 detects the low level and changes its output state from low to high. When the amplified high level voltage is generated at the output N3 of the amplifier 300, the inverter 401 detects the high level and changes its output state from high to low. The inverter 402 is provided to generate a voltage level detection signal (DET) that has a sharp transition waveform and a full VDD level swing. This is possible since the output of inverter 401 changes its state slowly and its high or low states are not the full VDD level (i.e., a high state is lower than the high VDD level and a low state is higher than ground voltage). If necessary, additional inverters can be added to buffer the output of inverter 401.

The VPP generator 500 operates in response to the DET signal and includes a conventional oscillator and pumping circuit. In initial chip operation, the VPP level is low since the pumping operation of the VPP generator 500 is not yet sufficient to supply extra voltage. The comparison voltage level at node N2 is therefore lower than the reference voltage level at node N1. The output N3 of the differential amplifier 300 and the DET signal are consequently both at a high level. The VPP generator 500 continues the pumping operation to boost the VPP in response to the high level DET signal. When the pumping operation causes the VPP level to reach the target level, the comparison voltage level at node N2 becomes higher than the reference voltage level at node N1. As a result, the output N3 of differential amplifier 300 and the DET signal drops to the low level. The VPP generator 500 stops the pumping operation in response to the low DET signal. Thereafter, as the VPP level becomes low, the DET signal becomes high and the VPP generator 500 resumes the pumping operation.

In the above explanation, most of the operations related to the differential amplifier (sense amplifier) 300 and the VPP generator (pumping circuit) 500 were described on the basis of the normal operation mode. It should be noted that the operation in the test mode is the same as that of the normal operation mode except that, in the test mode, the detection operation can take place even when the comparison voltage level is lower than that of the reference voltage. That is, in the test mode, the amplified low level voltage that can change the state of the DET signal can be generated by the bypass circuit 350 even if the comparison voltage level is lower than that of the reference voltage.

Figure 3:
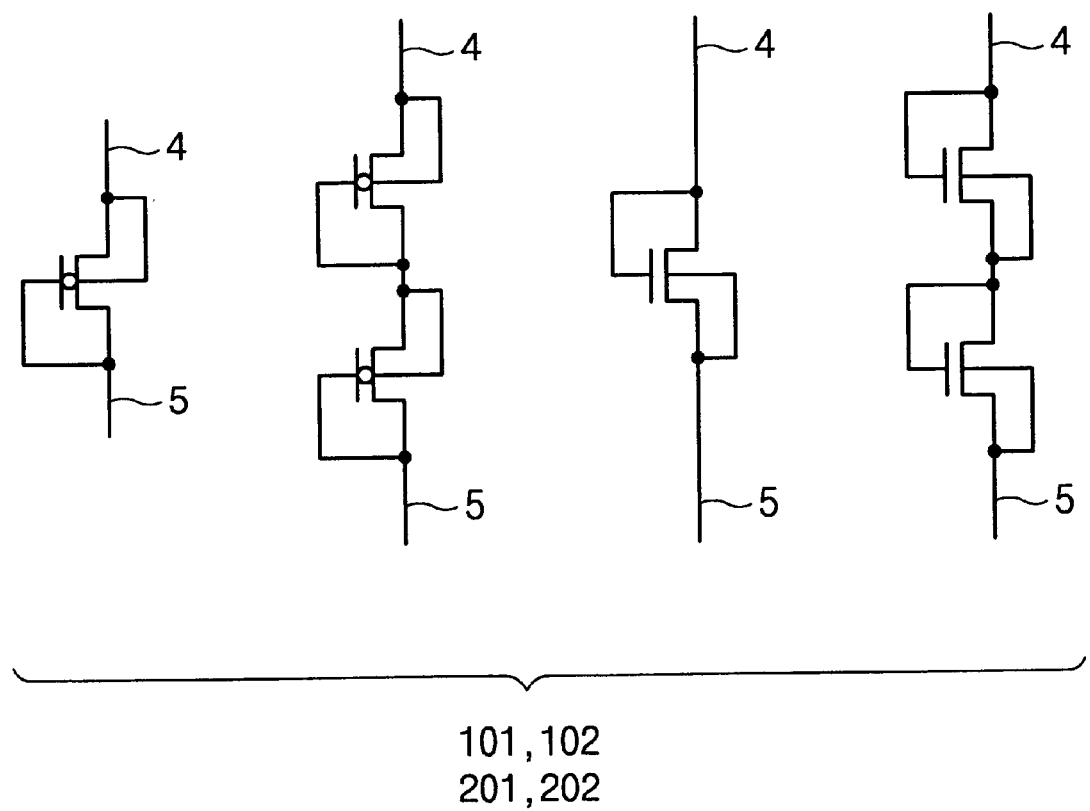
FIG. 3 provides a plurality of schematic circuit diagrams illustrating various diode-connected MOS resistors capable of use in the present invention.

FIG. 3 illustrates several diode-connected MOS transistors that can be used as resistors in the present invention. Each resistor of the present invention can include one or more diode-connected MOS transistors. When a PMOS transistor is used, the gate of the PMOS transistor is connected to a drain 5 having a relatively lower potential. When an NMOS transistor is used, the gate of the NMOS transistor is connected to a drain 4 having a relatively higher potential.

Figure 4A:
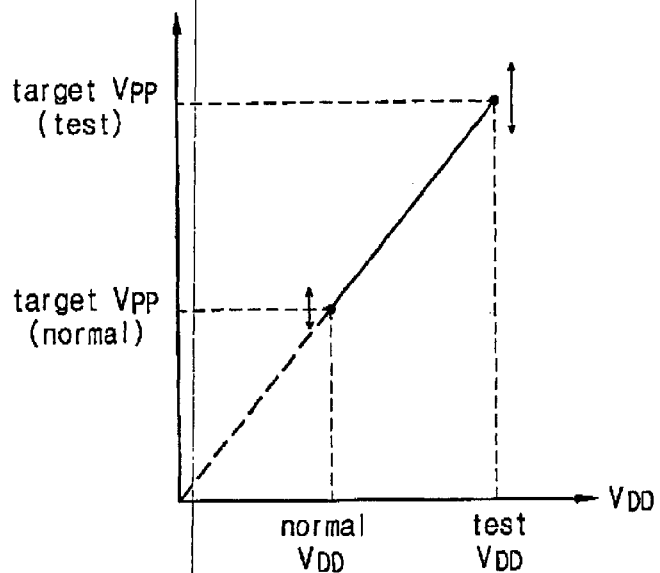
FIGS. 4A and 4B provide graphs comparing the invention (FIG. 4B) with the prior art (FIG. 4A) with respect to variations in target VPP at both operational modes due to process and temperature variations.
Figure 4B:
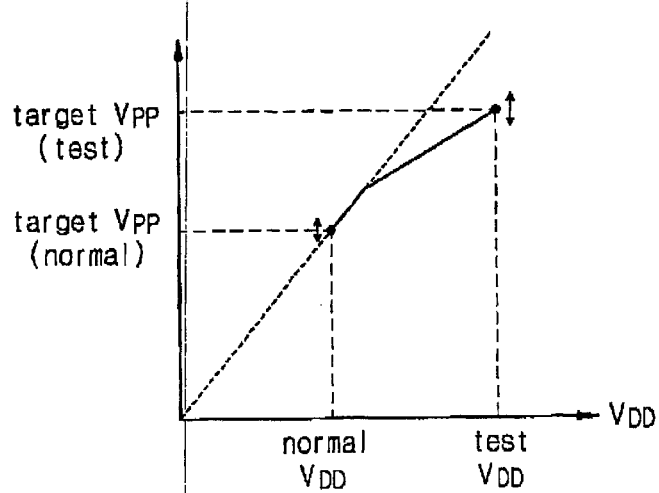

FIGS. 4A and 4B provides graphs comparing the invention (FIG. 4B) to the prior art (FIG. 4A) with respect to the variation of target VPP at both operational modes due to process and temperature variations. The vertical double-ended arrows represent variations in target VPP levels due to process and temperature variations. As seen from the graphs, the present invention can detect a precise target VPP level and provide a much more stable target VPP level than can the prior art. Specifically, even when there are process and temperature variations, the present invention supplies a stable differential voltage to the differential amplifier 300 because the reference and comparison voltages shift in the same direction. The voltages shift in the same direction because the voltage generators 100, 200 include only one kind of resistor. Those resistors can comprise either the diode-connected PMOS transistors or another one of the other transistors shown in FIG. 3.

It should also be noted that the voltage gain of the output node N3 of the differential amplifier 300 in response to the VPP level is so much higher than that of node A in the prior art that the variation of the logic threshold voltage of the inverter 401 can be compensated for. Moreover, the target VPP levels suitable for both operation modes can be provided by the bypass circuit 350 activated in the test mode. And various VDD values can be used for testing. Accordingly, as described above, the voltage detecting circuits of the invention provide a precise and stable detecting operation regardless of the mode of operation or the existence of process and temperature variations.

The foregoing description of preferred embodiments of the present invention has been presented for purposes of illustration and description only. It should be readily apparent that numerous modifications and variations are possible in light of the foregoing teachings. It should therefore be understood that, within the scope of the appended claims, the present invention can be practiced in manners other than as specifically described herein. The invention therefore should not be construed as being limited to the preferred embodiments described above but should be given its full range of coverage within the spirit and scope of the following claims.

What is claimed is:

1. An integrated circuit for a semiconductor memory device comprising:
    a first voltage generator, coupled to a first power supply voltage, for providing a reference voltage;
    a second voltage generator, coupled to a second power supply voltage, for providing a comparison voltage;
    a differential amplifier configured to receive the reference voltage and the comparison voltage and to generate an amplified voltage in response to voltage difference between the reference voltage and the comparison voltage;
    a bypass circuit coupled to an output of the differential amplifier, said bypass circuit configured to provide a current path to the amplified voltage in response to the comparison voltage;
    a driving circuit configured to receive the amplified voltage, said driving circuit further configured to generate a voltage level detection signal; and
    a third voltage generator configured to generate the second power supply voltage in response to the voltage level detection signal.

2. A memory device according to claim 1, wherein the integrated circuit is further configured to deactivate the voltage level detection signal when the second power supply voltage reaches a predetermined level.

3. A memory device according to claim 2, wherein the third voltage generator is configured to stop generating the second power supply voltage when the voltage level detection signal is deactivated.

4. A memory device according to claim 1, wherein the second power supply voltage is a boosted voltage of the first power supply voltage.

5. A memory device according to claim 1, wherein the bypass circuit is configured to provide the current path when the comparison voltage reaches a predetermined level.

6. A memory device according to claim 1, wherein:
    the first voltage generator comprises a first resistor and a second resistor coupled together in series between the first power supply voltage and a ground voltage;
    the second voltage generator comprises a third resistor and a fourth resistor coupled together in series between the second power supply voltage and the ground voltage; and
    the bypass circuit comprises a transistor and a diode-connected transistor coupled together in series between the output of the differential amplifier and the ground voltage, wherein the transistors are configured to turn on to provide the current path in response to the comparison voltage when the comparison voltage reaches a predetermined level.

7. A memory device according to claim 6, wherein the transistor and the diode-connected transistor of the bypass circuit are both NMOS transistors, and the predetermined level is twice an amount of a threshold voltage of one of the NMOS transistors.

8. A voltage detecting circuit for a semiconductor memory device, comprising:
    a first voltage generator coupled to a first power supply voltage, said first voltage generator configured to supply a reference signal;
    a second voltage generator coupled to a second power supply voltage, said second voltage generator configured to supply a comparison signal;
    a differential amplifier coupled to a third power supply voltage, said differential amplifier configured to provide an amplified signal in response to a voltage difference between the reference and comparison signals;
    a bypass circuit coupled to the amplified signal of the differential amplifier, said bypass circuit configured to provide a current path for the amplified signal in response to the comparison signal; and
    a driving circuit configured to receive the amplified signal, for providing a voltage level detection signal.

9. A voltage detecting circuit according to claim 8, wherein the first and third power supply voltages are a power supply voltage for a peripheral circuit, and wherein the second power supply voltage is a boosted voltage.

10. A voltage detecting circuit according to claim 8, wherein the first power supply voltage is a power supply voltage for a cell array, the second power supply voltage is a boosted voltage, and the third power supply voltage is a power supply voltage for a peripheral circuit.

11. A voltage detecting circuit of claim 8, wherein the bypass circuit is configured to begin to provide the current path when a voltage level of the comparison signal reaches a predetermined level.

12. A voltage detecting circuit according to claim 8, wherein:
    the first voltage generator comprises a first resistor and a second resistor coupled together in series between the first power supply voltage and a ground voltage;
    the second voltage generator comprises a third resistor and a fourth resistor coupled together in series between the second power supply voltage and the ground voltage;
    the bypass circuit comprises a transistor and a diode-connected transistor coupled together in series between the amplified signal of the differential amplifier and the ground voltage; and the transistor and diode-connected transistor are both configured to be turned on to provide the current path in response to the comparison signal when a voltage level of the comparison signal reaches a predetermined level.

13. A voltage detecting circuit according to claim 12, wherein the second power supply voltage is a boosted voltage.

14. A voltage detecting circuit according to claim 13, wherein the first, second, third and fourth resistors comprise diode-connected MOS transistors of a same transistor type.

15. A voltage detecting circuit according to claim 14, wherein the transistor and the diode-connected transistor of the bypass circuit are each NMOS transistors, and wherein the predetermined level is twice an amount of a threshold voltage of one of the NMOS transistors.

16. A method for providing a stable boosted voltage level in a semiconductor memory device, said method comprising:
   detecting a reference voltage;
   detecting a comparison voltage;
   amplifying a difference between the reference voltage and the comparison voltage to produce an amplified difference signal; and
   providing a current path for the amplified difference signal in response to the comparison voltage.

17. A method according to claim 16, further comprising producing a voltage level detection signal in response to the amplified difference signal.

18. A method according to claim 17, further comprising generating a power supply voltage in response to the voltage level detection signal.

19. A method according to claim 18, further comprising deactivating the voltage level detection signal when the power supply voltage reaches a predetermined level.

20. A method according to claim 16, wherein amplifying a difference between the reference voltage and the comparison voltage is done using a differential amplifier.

* * * * *